United States Patent
Higashi et al.

(10) Patent No.: US 7,383,093 B2
(45) Date of Patent: Jun. 3, 2008

(54) SUBSTRATE PROCESSING APPARATUS AND SUBSTRATE PROCESSING METHOD

(75) Inventors: Makio Higashi, Koshi (JP); Akira Miyata, Koshi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/525,854

(22) Filed: Sep. 25, 2006

(65) Prior Publication Data

US 2007/0016320 A1    Jan. 18, 2007

Related U.S. Application Data

(63) Continuation of application No. PCT/JP2005/001484, filed on Feb. 2, 2005.

(30) Foreign Application Priority Data

Mar. 31, 2004  (JP) ............................. 2004-106133

(51) Int. Cl.
*G06F 19/00* (2006.01)
(52) U.S. Cl. ...................................... 700/100; 700/121
(58) Field of Classification Search ........ 700/100–102, 700/112, 121
See application file for complete search history.

(56) References Cited

U.S. PATENT DOCUMENTS

| | | | |
|---|---|---|---|
| 6,282,457 B1 * | 8/2001 | Miura et al. ................. | 700/121 |
| 7,008,124 B2 * | 3/2006 | Miyata ........................ | 396/611 |
| 7,069,099 B2 * | 6/2006 | Hashinoki et al. .......... | 700/112 |
| 7,313,452 B2 * | 12/2007 | Kobayashi et al. ......... | 700/100 |
| 2002/0045967 A1 * | 4/2002 | Nakano et al. ............. | 700/121 |
| 2003/0216053 A1 | 11/2003 | Miyata | |
| 2004/0026036 A1 * | 2/2004 | Shimeno et al. ........ | 156/345.31 |
| 2005/0015174 A1 * | 1/2005 | Arai et al. .................. | 700/121 |
| 2006/0195216 A1 * | 8/2006 | Hashinoki et al. .......... | 700/112 |

FOREIGN PATENT DOCUMENTS

| | | |
|---|---|---|
| JP | 10-335416 A | 12/1998 |
| JP | 2002-217264 A | 8/2002 |
| JP | 2003-324059 A | 11/2003 |

* cited by examiner

*Primary Examiner*—Zoila Cabrera
(74) *Attorney, Agent, or Firm*—Oblon, Spivak, McClland, Maier & Neustadt, P.C.

(57) ABSTRACT

A substrate processing apparatus of the invention comprises a transfer schedule creating section, a transfer schedule storage section, a transfer control section which controls, by referring to the transfer schedule, plural transfer mechanisms so as to transfer a substrate written into data of a cycle containing plural transfer operations to a module corresponding to the substrate, and a standby position control section which operates such that, by referring to the transfer schedule stored in the transfer schedule storage section, after one transfer mechanism completes the transfer operations allotted to itself in one cycle, and during a period that another transfer mechanism executes the transfer operations allotted to itself in the one cycle, the standby position control section moves the one transfer mechanism and puts the one transfer mechanism on standby at a front module when viewed in the transfer operation in the modules allotted thereto in a next cycle.

12 Claims, 14 Drawing Sheets

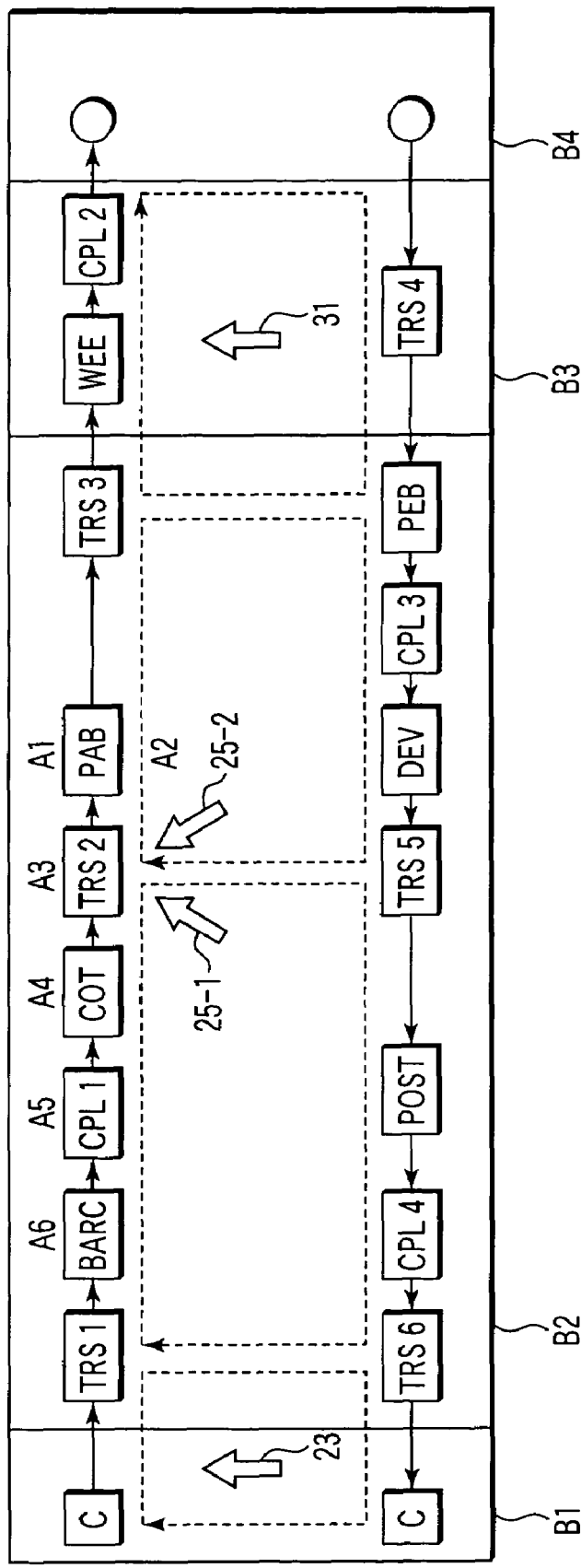
F I G. 10

SUBSTRATE PROCESSING APPARATUS AND SUBSTRATE PROCESSING METHOD

CROSS REFERENCE TO RELATED APPLICATIONS

This is a Continuation Application of PCT Application No. PCT/JP2005/001484, filed Feb. 2, 2005, which was published under PCT Article 21(2) in Japanese.

This application is based upon and claims the benefit of priority from prior Japanese Patent Application No. 2004-106133, filed Mar. 31, 2004, the entire contents of which are incorporated herein by reference.

BACKGROUND OF THE INVENTION

1. Field of the Invention

The present invention relates to a substrate processing apparatus and substrate processing method for coating a glass substrate (LCD substrate) for a semiconductor wafer and liquid crystal display with resist, and for developing the exposed resultant.

2. Description of the Related Art

Jpn. Pat. Appln. KOKAI Publication No. 2002-217264 discloses a system in which a coating/developing apparatus for executing a photolithography process of a semiconductor device is combined with an exposure device. FIG. 14 shows an outline of a conventional system. A coating/developing apparatus 1 is provided with a carrier placing section 1A, a treatment block 1B and an interface section 1C. An exposure device 1D is connected to the coating/developing apparatus 1 through the interface section 1C. A delivery arm 11 for transferring a wafer W to the treatment block 1B is provided in the carrier placing section 1A. Main carrier arms 12-1 and 12-2 are provided in the treatment block 1B. The main carrier arms 12-1 and 12-2 are each provided with, for example, three arm holders which are movable forward, backward and vertically, and horizontally rotatable. Heating units, shelf units 13 and chemical treatment units 14 are arranged around the main carrier arms 12-1 and 12-2. The chemical treatment unit 14 includes a coating unit for a reflection preventing film, a resist coating unit, and a developing unit. The shelf unit 13 includes a stack of cooling units as high-precision temperature control sections.

The shelf unit 13 includes delivery units (not shown) for delivering substrates; one delivery unit delivering a substrate between the delivery arm 11 and the main transfer arm 12-1, another delivery unit delivering a substrate between the delivery arm 11 and the main transfer arm 12-1, and an additional delivery unit delivering a substrate between the main transfer arm 12-2 and a transfer arm (not shown) in the interface section 1C.

A path where the wafer W is carried out from a carrier C and to the exposure device 1D is referred to as a "going path", and its reverse path is referred to as a "return path". When traveling through the going path, the wafer W is subjected to various processings for forming a resist film, and when traveling through the return path, the wafer is subjected to a processing for developing a resist film after it is exposed. A transfer path of the wafer W to execute the photolithography process is: carrier C→coating unit for a reflection preventing film (chemical treatment unit 14)→cooling unit (shelf unit 14)→resist coating unit (chemical treatment unit 14)→heating unit→cooling unit→interface block 1C→exposure device 1D→interface block 1C→heating unit→cooling unit→developing unit (chemical treatment unit 14)→cooling unit→carrier C.

To transfer the wafer W, a transfer recipe describing a transfer order of the wafer W is input to a computer. In turn, the computer creates a transfer schedule according to the transfer recipe.

The unit and the stage where the wafer W is to be placed will be referred to as a "module". The "transfer recipe" is a table describing the transfer order of the wafer W assigned to modules. A "transfer schedule" is a timetable in which transfer cycles (phases) are time sequentially arranged as shown in FIG. 8, for example. "Phase" defines the wafer W and the modules where the wafer W is to be located in order to transfer the wafer W between the modules along and over a range from the upstream to the downstream of a transfer path including the going path and the return path.

Accordingly, the computer refers to this phase to drive the delivery arm 11, the main carrier arms 12-1 and 12-2, and the transfer arm (not shown) in the interface block 1C so as to satisfy the positional relationship between the wafer W and the modules as described in the phase, and executes one phase, followed by execution of a next phase. In this way, the computer sequentially executes the phases, so that the wafer W sequentially moves along the known transfer path.

In such a system, the number of modules is large, and the processing times for the modules are different from one another. In this respect, how to gain high throughput of the system is of very important significance. To spread the loads of transfer, the modules are shared by the two main carrier arms 12-1 and 12-2 in the treatment block 1B.

Meanwhile, one phase contains the transfer operation by the first main carrier arm 12-1 and that by the second main carrier arm 12-2. When the first main carrier arms 12-1 or 12-2 complete the transferring job of transferring the wafer W to modules allotted to itself in a phase, they return to their original positions, and stand by until a next phase starts.

Recently, the throughput of the exposure device 1D tends to increase. With this, there is a demand of increasing the throughout also in the coating/developing apparatus 1. However, the throughput of the conventional coating/developing apparatus 1 is not so high. For this reason, the coating/developing apparatus 1 hinders the improvement of the throughput of the overall system.

BRIEF SUMMARY OF THE INVENTION

Accordingly, an object of the present invention is to provide a substrate processing apparatus and substrate processing method for improving a system throughput.

According to one aspect of the present invention, there is provided a substrate processing apparatus comprising a group of modules which apply parallel processing to a plurality of substrates of which the transfer order is designated, and a plurality of substrate transfer mechanisms for transferring substrates to the modules of the module group, wherein each of the substrate transfer mechanisms executes one transfer cycle by sharing the operations of transferring a substrate from one module to another module later by one in order by the substrate transfer mechanisms, shifts to a next transfer cycle after executing the one transfer cycle, and executes the next transfer cycle, whereby the substrates are sequentially transferred from the module being low in order in the module group to the module being high in order, the substrate processing apparatus further comprising:

a transfer schedule creating section (43) which assigns a transfer order to said plurality of substrates according to a predetermined transfer recipe, relates the assigned transfer order of the substrate to the modules to specify a transfer cycle, and creates a transfer schedule by time sequentially arranging data of the specified transfer cycle;

a transfer schedule storage section (44) which stores the transfer schedule created by the transfer schedule creating section;

a transfer control section (45) which controls, by referring to the transfer schedule, the substrate transfer mechanism so as to transfer a substrate written into the data of the transfer cycle to a module corresponding to the substrate, thereby causing the substrate transfer mechanism to execute the transfer cycle; and a standby position control section which operates such that, by referring to the transfer schedule stored in the transfer schedule storage section, after one of said plurality of substrate transfer mechanisms completes the transfer operations allotted to itself in one transfer cycle, and during the execution of the one transfer cycle by another substrate transfer mechanism, the standby position control section moves the one substrate transfer mechanism to a front module to which the substrate is to first be transferred in a next module and puts the one substrate transfer mechanism on standby.

In the invention, the transfer control section causes the one substrate transfer mechanism to sequentially transfer the substrate to a plurality of modules allotted to the one substrate transfer mechanism in the one transfer cycle, and then causes the other substrate transfer mechanism to sequentially transfer the substrate to a plurality of modules allotted to the other substrate transfer mechanism. The standby position control section causes the one substrate transfer mechanism to move to a front module to which the substrate is to first be transferred, in those modules allotted to the one substrate transfer mechanism in the one transfer cycle, and puts the one substrate transfer mechanism on standby until a next transfer cycle starts. The transfer control section causes the one substrate transfer mechanism to sequentially transfer again the substrate to the modules allotted to the one substrate transfer mechanism in the next transfer cycle.

In the invention, the other substrate transfer mechanism is provided between a carrier containing a plurality of substrates and a delivery unit, and the one substrate transfer mechanism is provided between each module of the module group and the delivery unit.

In the invention, the one substrate transfer mechanism is provided between the adjacent modules of the module group, and the other substrate transfer mechanism is also provided between the adjacent modules of the module group.

Further, the substrate transfer mechanism takes out a first substrate from one module of the module group, receives a second substrate from a next module of the module group, and then transfers the first substrate to the next module.

Furthermore, when a plurality of modules of which the lots are different are contained in the modules allotted to the substrate transfer mechanism, the substrate transfer mechanism transfers first the substrate of the lot, which is first transferred to the module of those allotted thereto.

Moreover, the module group includes a module which coats a substrates with resist, a module which coats a substrate with a developer, a module which heats a substrate, and a module which cools a substrate, whereby a substrate is subjected to resist coating treatment, and the resultant having been exposed is subjected to developing treatment.

According to another aspect of the present invention, there is provided a substrate treatment method in which, when a plurality of substrates to which a transfer order is assigned are transferred to individual modules of a module group by means of a plurality of substrate transfer mechanisms, each of the substrate transfer mechanisms executes one transfer cycle by sharing the operations of transferring a substrate from one module to another module later by one in order by the substrate transfer mechanisms, shifts to a next transfer cycle after executing the one transfer cycle, and executes the next transfer cycle, whereby the substrates are sequentially transferred from the module low in order of the module group to the module high in order, the method comprising:

a) a step of sequentially transferring the substrates to and from the modules allotted to one substrate transfer mechanism by the one substrate transfer mechanism;

b) a step of transferring the substrate from the one substrate transfer mechanism to another substrate transfer mechanism through the module, and sequentially transferring the substrates to and from the modules allotted to the other substrate transfer mechanism by the other substrate transfer mechanism; and c) a step of, by referring to a transfer schedule of subsequent lots, after one substrate transfer mechanism of said plurality of substrate transfer mechanisms completes the transfer operations allotted to itself in one transfer cycle, and during execution of the one transfer cycle by another substrate transfer mechanism, moving the one substrate transfer mechanism and putting the one substrate transfer mechanism on standby at a front module to which the substrate is to first be transferred in a next transfer cycle.

In the invention, to execute the resist coating and the developing processes, the operation is executed such that, after one substrate transfer mechanism ends the transfer operations allotted to the mechanism in one transfer cycle and during a period that the one transfer cycle is executed by another substrate transfer mechanism, a transfer schedule is referred to, thereby positioning one substrate transfer mechanism before a front module involved in a transfer operation of the transfer allotted to the substrate transfer mechanism in a next transfer cycle to put the substrate transfer mechanism on standby. Accordingly, the transfer cycles are swiftly executed to provide high system throughput.

BRIEF DESCRIPTION OF THE SEVERAL VIEWS OF THE DRAWING

FIG. 10 is a plan view showing in model form positional relationships between respective transfer mechanisms in the middle of a transfer cycle and wafers.

DETAILED DESCRIPTION OF THE INVENTION

One embodiment in which a substrate processing apparatus according to the present invention is applied to a coating/developing apparatus will be described with reference to the accompanying drawings.

Figure 1:
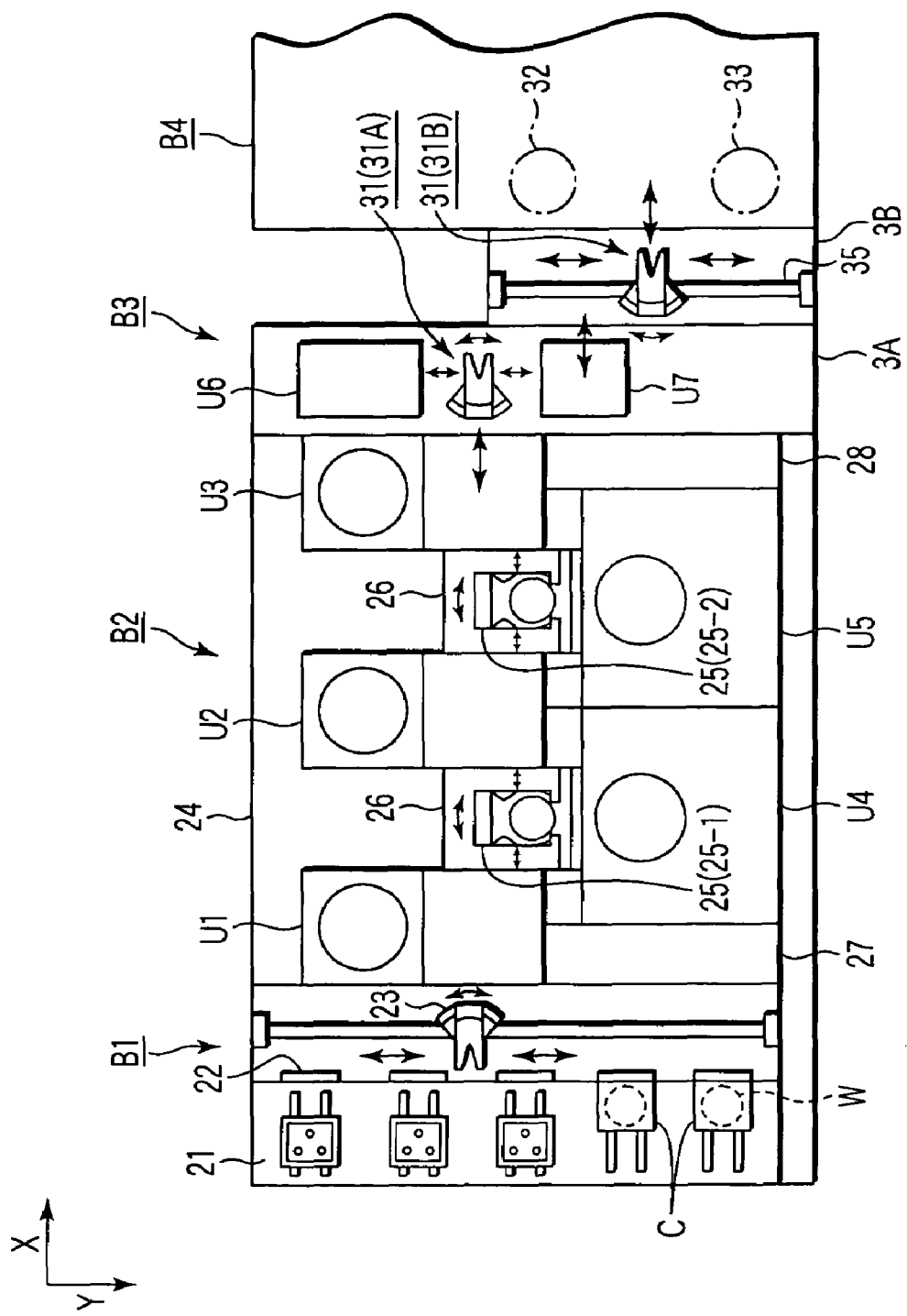
FIG. 1 is a plan view schematically showing a substrate processing apparatus (including a coating/developing apparatus) according to the present invention.

In FIG. 1, reference symbol B1 denotes a carrier placing section for transferring in and out a carrier C sealingly containing, for example, 13 semiconductor wafers W. The carrier placing section B1 includes a carrier placing table 21 which allows a plurality of carriers C to be placed, opening/closing sections 22 provided in a front wall of the carrier placing table 21, and a delivery arm 23 (substrate transfer mechanism). The delivery arm 23 takes out a wafer W from each carrier C through its associated opening/closing section 22.

A treatment block B2 enclosed by a housing 24 is connected to the back side of the carrier placing section B1. The treatment block B2 contains three shelf units U1, U2 and U3 arranged from this side to the back side, each of which contains stacks of heating and cooling units. Main transfer mechanisms 25-1 and 25-2 are alternately arranged, which transfer wafers W to and from the units, including various kinds of units to be described later, and are movable forward and backward and rotatable around the vertical axis. Specifically, the shelf units U1, U2 and U3 and the main transfer mechanisms 25-1 and 25-2 are longitudinally arranged in a series when viewed from the carrier placing section B1. Openings (not shown) for wafer transfer are formed at connection parts, respectively. The wafer W is freely movable within the treatment block B2 in a range from the shelf unit U1 located at one end to the shelf unit U3 at the other end.

Figure 3:
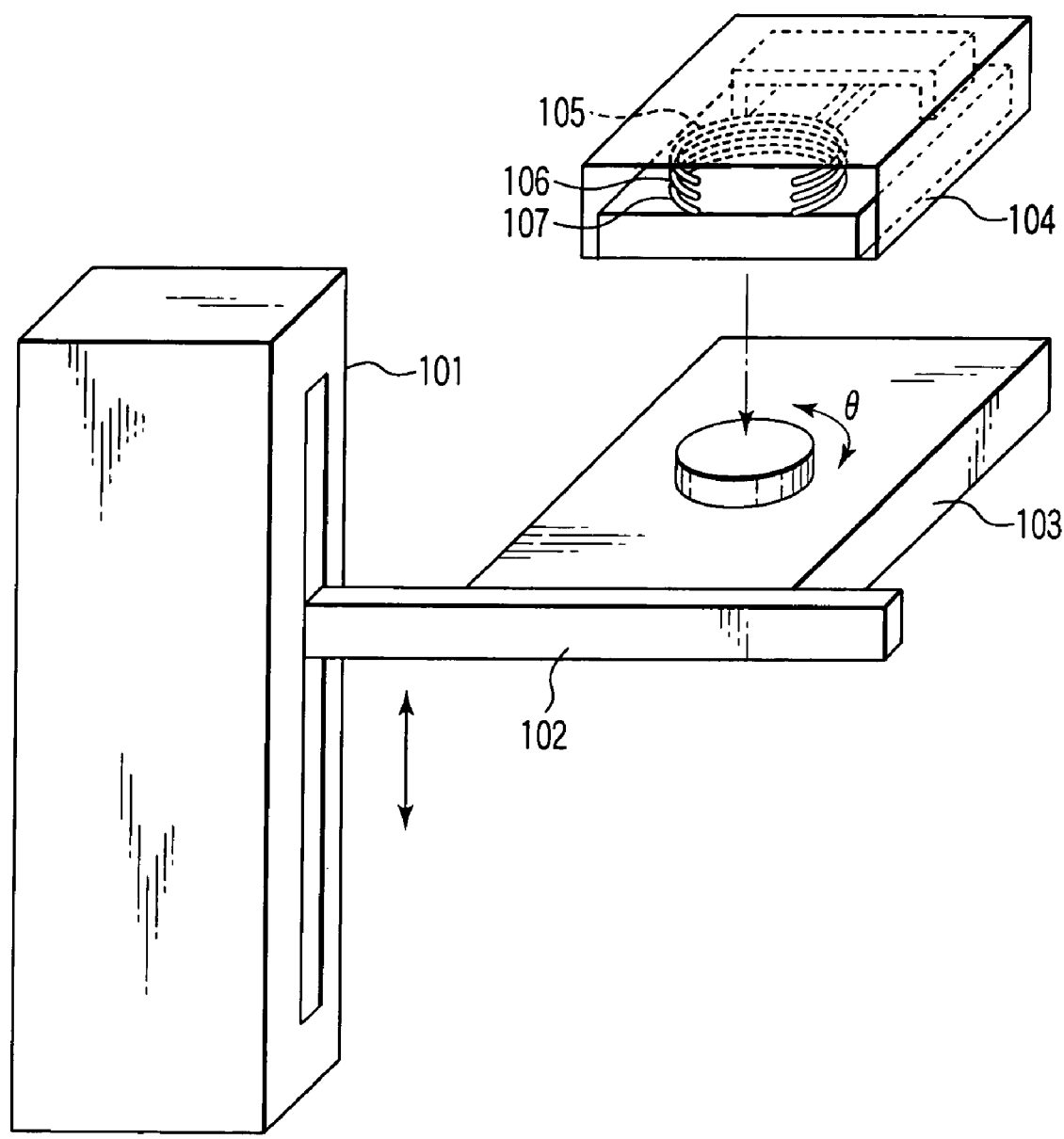
FIG. 3 is an exploded perspective view showing a main transfer mechanism for use in the coating/developing apparatus.

The main transfer mechanisms 25-1 and 25-2 are each located within a space enclosed by a partition wall 26, which includes sides close to the shelf units U1, U2 and U3 arranged in the front/rear direction as viewed from the carrier placing section B1, one side close to the chemical treatment units U4 and U5 located on the right side, and a rear side located on the left side. FIG. 3 is an exploded perspective view showing a part of the main transfer mechanism 25-1, 25-2. Reference numeral 101 denotes a column. Actually, another column is also provided on the right side in FIG. 3. A lift bar 102 is located between the columns 101.

A base 103 is fixed to the lift bar 102. An arm mechanism 104 is mounted on the base 103 in such a manner that the former is rotatable about the vertical axis (within an angular range of θ). The arm mechanism 104 is provided with three arms 105 to 107, which are movable forward and backward in an independent manner. Accordingly, the main transfer mechanism 25-1 (25-2) carries a wafer W among the shelf units U1 and U2 and the chemical treatment unit U4 (shelf units U2 an U3, and chemical treatment unit U5). In the figure, reference numerals 27 and 28 stand for temperature/humidity adjusting units, which include ducts for temperature adjusting devices and humidity adjusting devices, both provided for the treating solutions used by respective units.

Figure 2:
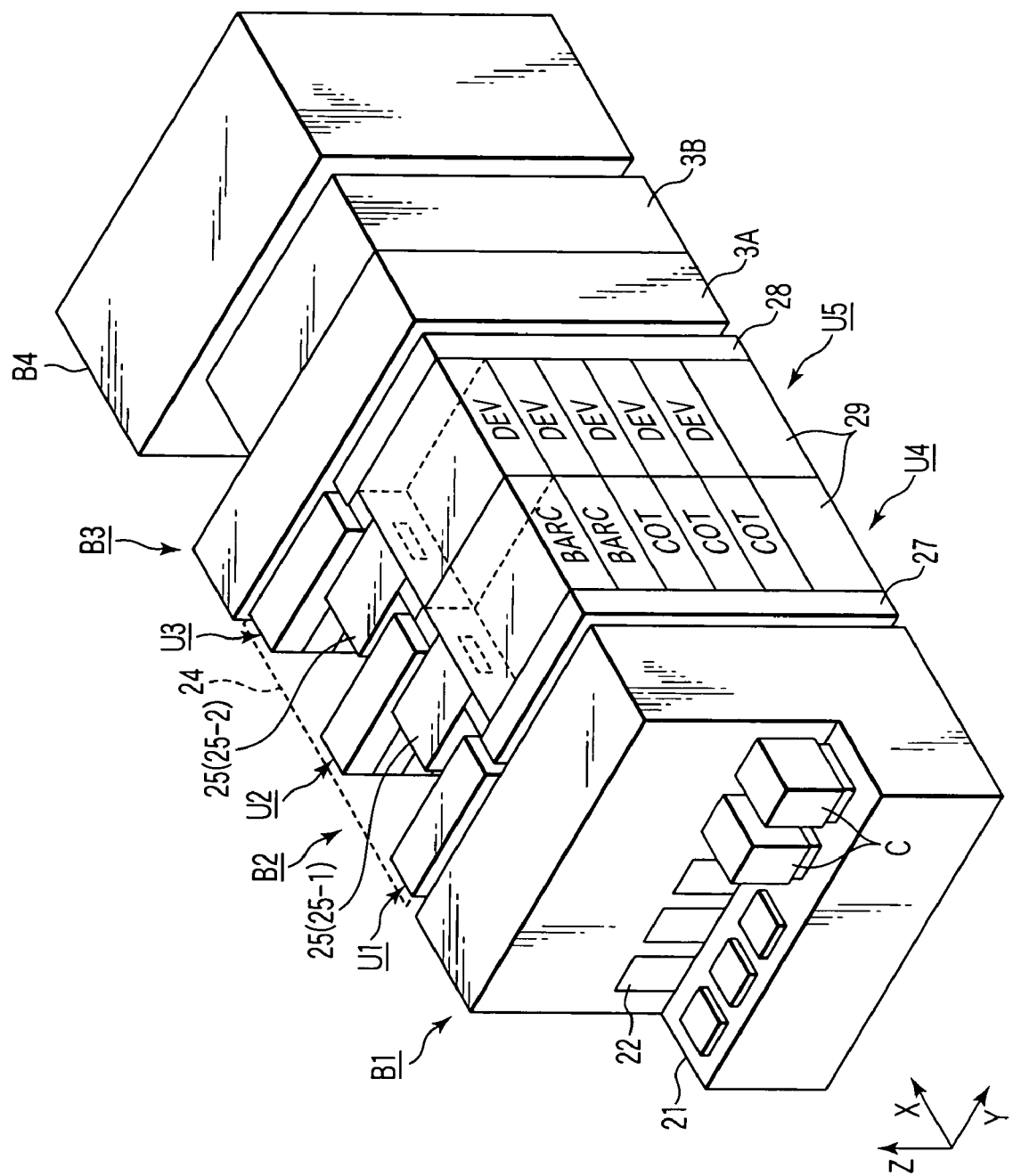
FIG. 2 is a perspective view schematically showing the coating/developing apparatus.

The chemical treatment units U4 and U5 are constructed such that, as shown in FIG. 2, reflection preventing film-coating units (BARC), resist coating units (COT), and developing units (DEV) are stacked on a container section 29 providing a space for supplying liquid chemicals, such as a liquid chemical for a reflection preventing film, a resist solution, and a developer. The coating unit for a reflection preventing film and the resist coating unit are referred simply to as a "reflection preventing film unit" and a "coating unit", respectively, for simplicity of expression.

Various types of units for pre- and post-treatments of processings to be performed in the chemical treatment units U4 and U5 are vertically stacked in the shelf units U1, U2 and U3. Those units for the pre- and post-treatments are, for example, cooling units (CPL1), pre-baking units (PAB), cooling units (CPL3), post-baking units (POST), and cooling units (CPL4). The cooling unit (CPL1) adjusts the temperature of a wafer W having been treated by the reflection preventing film-coating unit (BARC) to a predetermined temperature before resist solution coating. The pre-baking unit (PAB) heats the wafer having been coated with the resist solution. Each of post-exposure baking units (PEB) heats the wafer W having undergone exposure. The cooling unit (CPL3) adjusts temperature of the wafer W having been heated by the unit (PEB) to a predetermined temperature before the wafer is developed. The post-baking unit (POST) heats the wafer W having been developed. The cooling unit (CPL4) cools the wafer W having been heated by the unit (POST).

Figure 4:
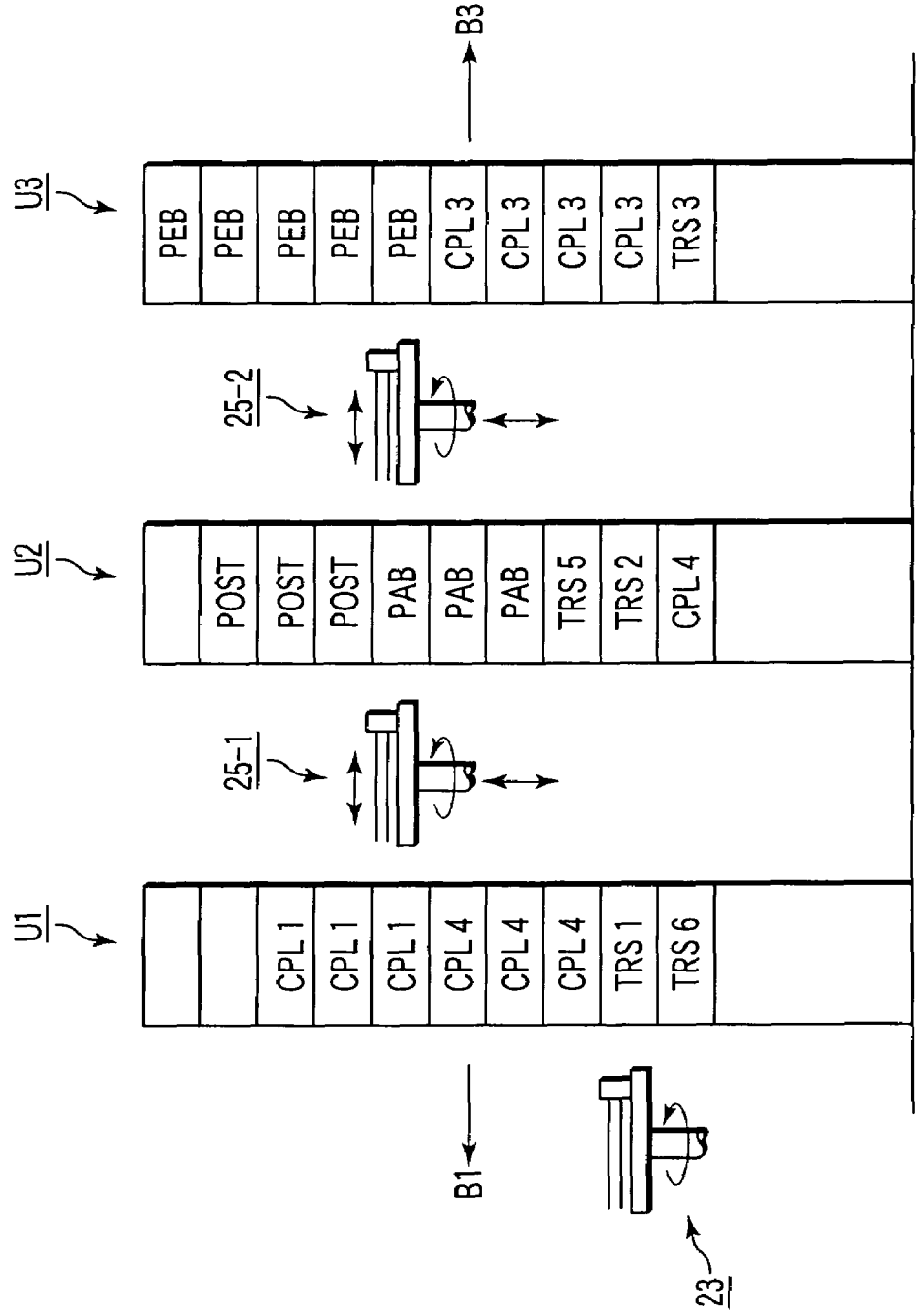
FIG. 4 is a side view showing a structure of shelf units in the coating/developing apparatus.

FIG. 4 shows exemplary layouts of those units. For example, five heating units (PEB) are stacked. It should be understood that the layouts shown in FIG. 4 are illustrated by way of example, and the number of units installed are determined in consideration with processing times, etc., of respective units, in an actual apparatus. The shelf units U1, U2 and U3, as shown in FIG. 4, are provided with delivery units (TRS1 to TRS3, and TRS5) having delivery stages for delivering the wafer W. In this example, the pre-baking units (PAB) and (POST) include heating plates, and are accessible from the main transfer mechanisms 25-1 and 25-2.

The units on which the wafer W is placed include openings through which the wafer W is carried in and out, delivery arms 23 for placing the wafer W on the units, and lift pins for delivering the wafer W to and from the transfer mechanism such as the main transfer mechanisms 25-1 and 25-2.

Figure 5A:
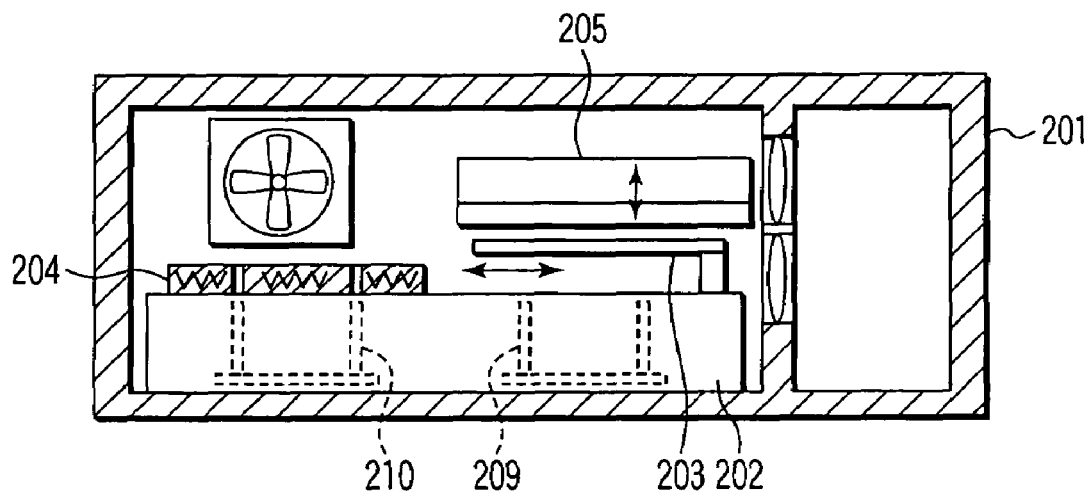
FIG. 5A is a longitudinal sectional view-showing a heating unit (PEB) of the shelf unit.
Figure 5B:
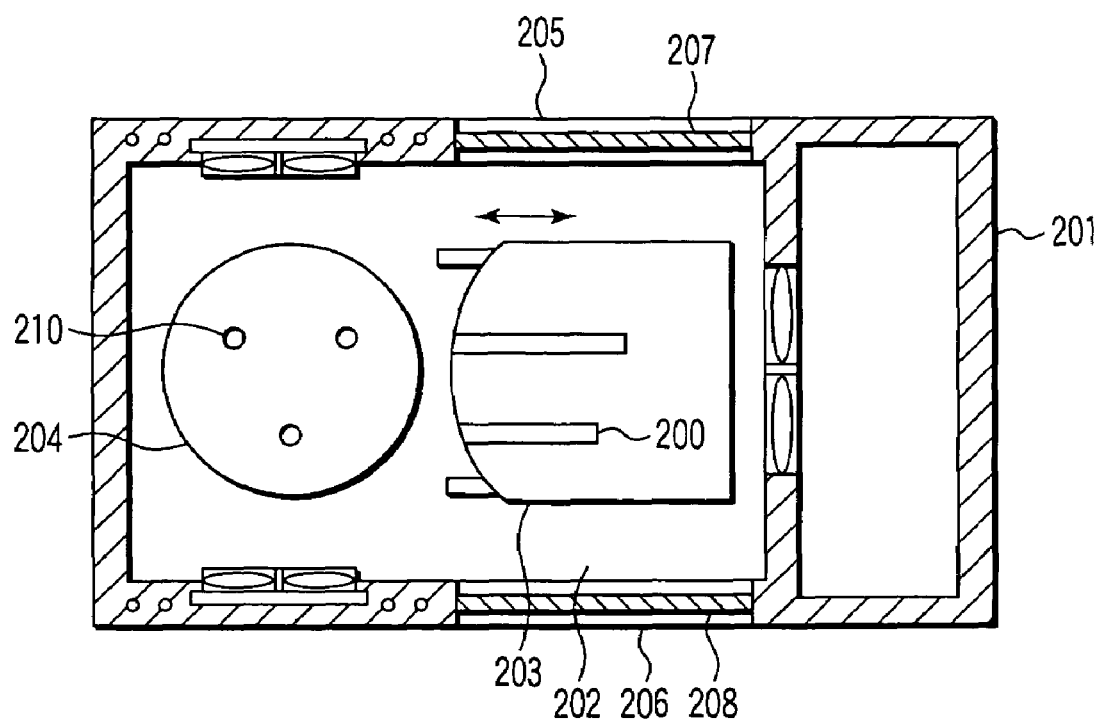
FIG. 5B is a plan view showing the heating unit (PEB) of FIG. 5A.

An outline of the heating unit (PEB) will be described with reference to FIGS. 5A and 5B.

In the figures, reference numeral 201 is a housing; 202 is a stage; 203 is a cooling plate; 204 is a heating plate; 205 and 206 are carry-in/out ports for the wafer W; 207 and 208 are shutters; and 209 and 210 are lift pins.

The cooling plate 203, located above the stage 202, is horizontally movable and includes slits 200 formed therein so as to avoid interference with the lift pins 209 and 210. The shutters 207 and 208 are provided for opening and closing the carry-in/out ports 205 and 206, respectively. The lift pins 209 and 210, each consisting of three pins, are vertically movable.

The main transfer mechanism 25-2 is accessible to the inside of the housing 201 through the carry-in/out port 205, and a transfer arm 31 to be described later in an interface unit B3 is accessible to the inside of the housing 201 through the carry-in/out port 206. In the heating unit (PEB), a wafer W on the transfer arm 31 is transferred to the cooling plate 203 with the aid of the lift pin 209 when the transfer arm 31 advances through the carry-in/out port 206 into the housing. The cooling plate 203 moves and the lift pin 210 lifts, so that the wafer W is transferred between the cooling plate 203 and the heating plate 204. The wafer W having been heated is carried out by the main transfer mechanism 25-2 through the carry-in/out port 205.

As shown in FIG. 1, the rear side of the shelf unit U3 in the treatment block B2 is connected to a exposure device B4 with the interface unit B3 being interposed between them. The interface unit B3 is provided with a main transfer arm 31A and an auxiliary transfer arm 31B. The main transfer arms 31A and 31B will be referred to as a transfer arm 31 for ease of explanation. The transfer arm 31 is vertically movable, rotatable about the vertical axis, and movable forward and backward.

The interface unit B3 includes an edge exposure device (WEE) for selectively exposing only the edge part of the wafer W, a delivery unit (TRS4), and a high-precision temperature control section CPL2 with a cooling plate. These are illustrated in the drawings for explanation of the operation and effects of the invention to be given later. In FIG. 1, these are provided in the shelf units U6 and U7. Actually, a buffer cassette for temporarily containing plural wafers, for example, 25 wafers W, is provided. However, it is not described for simplicity of explanation.

Figure 6:
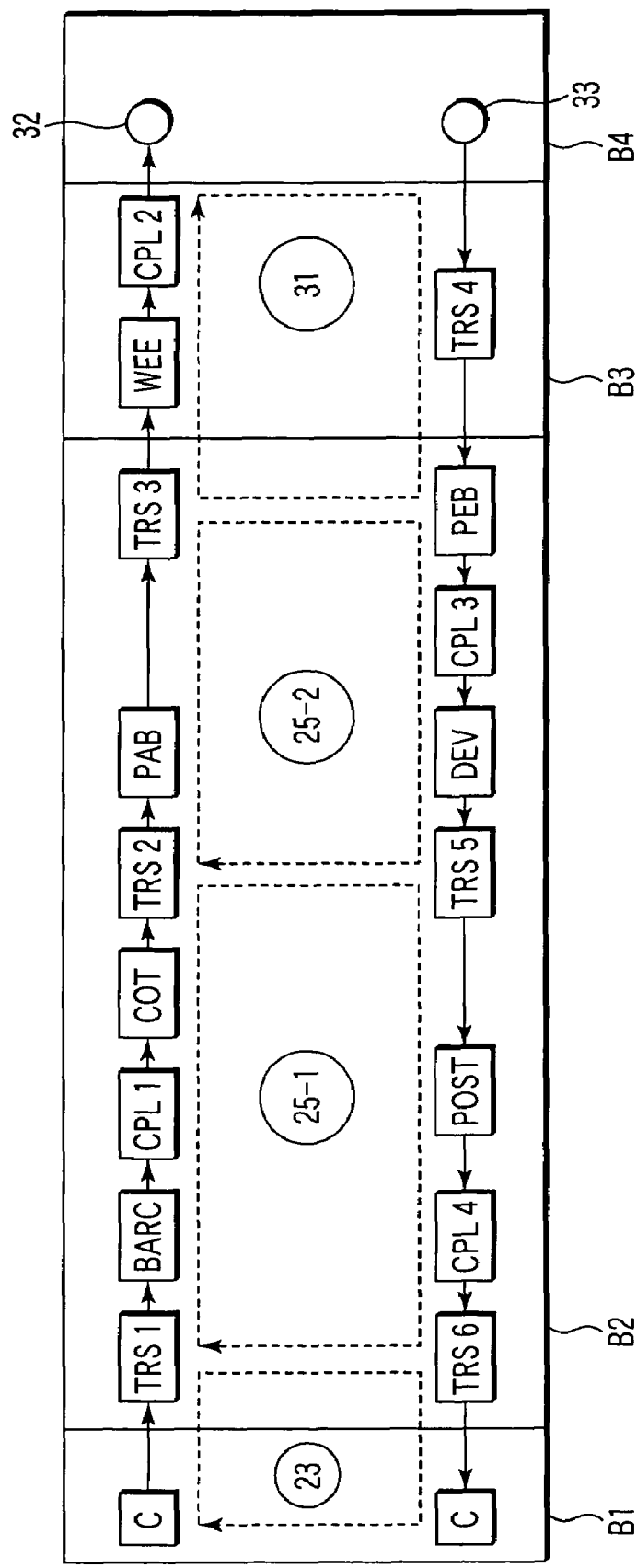
FIG. 6 is a plan view showing a transfer path for a wafer in the coating/developing apparatus.

Operations of the delivery arm 23 in the carrier placing section B1, the main transfer mechanisms 25-1 and 25-2 in the treatment block B2, and the transfer arms 31A and 31B in the interface section B3 will be described with reference to FIGS. 4 and 6. The delivery arm 23 carries the wafer W, which is not yet treated in the carrier C placed on the carrier placing section B1, to the delivery unit (TRS1), and carries the treated wafer W, which has been developed and placed on the delivery unit (TRS6), to the carrier C described above.

The main transfer mechanism 25-1 carries the wafer W placed on the delivery unit (TRS1) to the reflection preventing film-coating unit (BARC), the cooling unit (CPL1), the coating unit (COT), and the delivery unit (TRS2) in this order. Further, the main transfer mechanism 25-1 carries the wafer W, which has been developed and placed on the delivery unit (TRS5), to the heating unit (POST), the cooling unit (CPL4), and the delivery unit (TRS6) in this order. The main transfer mechanism 25-2 carries the wafer W, which has undergone the resist coating treatment and placed on the delivery unit (TRS2), to the heating unit (PAB) and the delivery unit (TRS3). Further, the main transfer mechanism 25-2 carries the wafer W, which has been exposed, carried out of the interface section B3, and placed in the heating unit (PEB), to the cooling unit (CPL3), the developing unit (DEV), and the delivery unit (TRS5) in this order.

The transfer arm 31 (31A and 31B) transfers sequentially the wafer W, not yet exposed, which is placed on the delivery unit (TRS3), to the edge exposure device (WEE), the high-precision temperature control section CPL2, and a carry-in stage 32 for the exposure device B4, and transfers wafer W having been exposed, which is placed on a carry-out stage 33 located close to the exposure device B4, to the delivery unit (TRS4) and the heating unit (PEB). Note that those transfer jobs are shared by the main transfer arms 31A and 31B.

Figure 7:
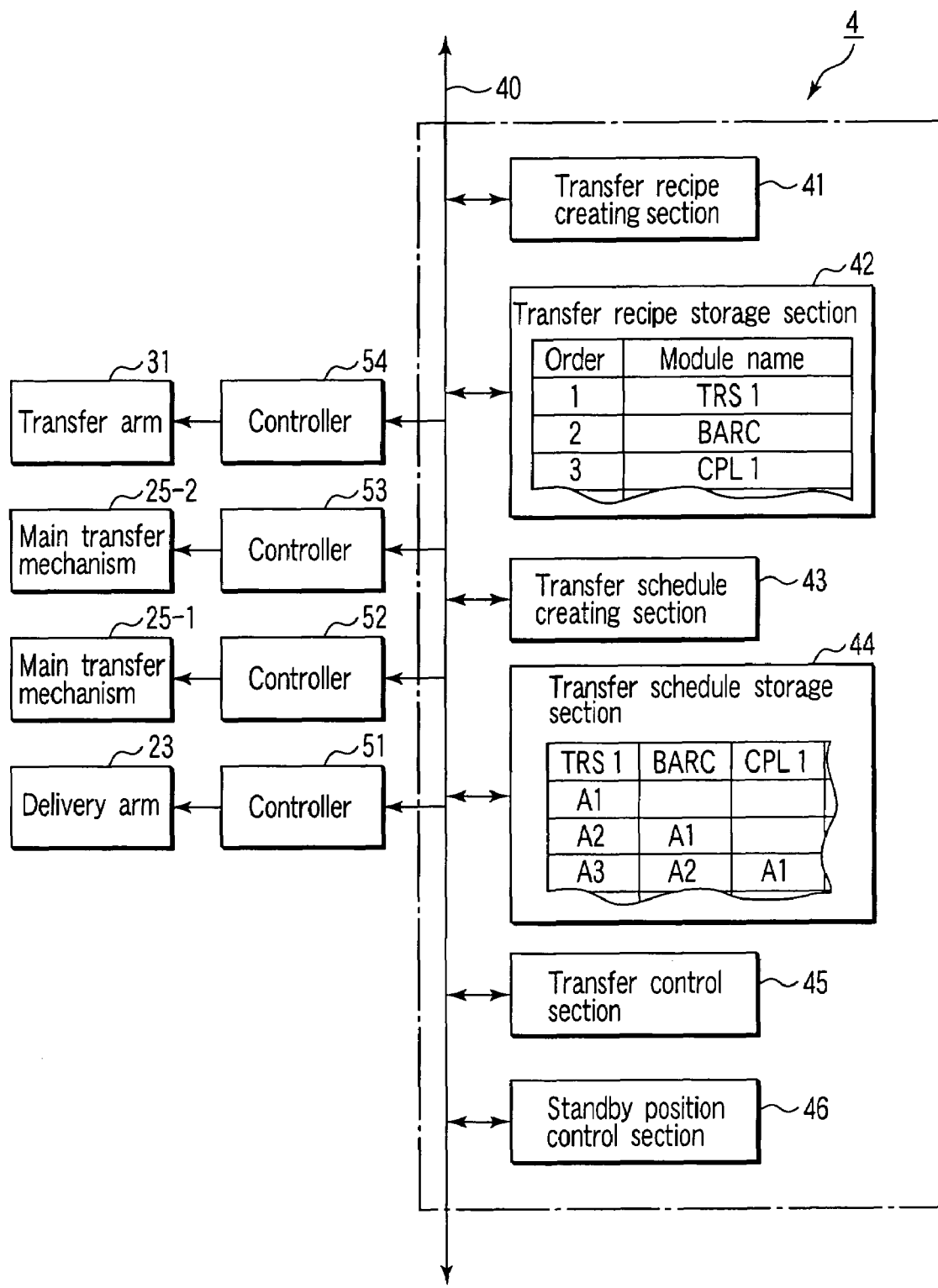
FIG. 7 is a control block diagram showing a control configuration of the coating/developing apparatus.

The resist pattern forming device includes a control section 4 for driving and controlling the delivery arm 23, the main transfer mechanisms 25-1 and 25-2, and the main transfer arms 31A and 31B, and for controlling other processing units. FIG. 7 shows a configuration of the control section 4. Actually, the control section contains a central processing unit (CPU), programs, memories, etc. In the figure, some of the components are illustrated in block form.

In FIG. 7, reference numeral 40 indicates a system bus. Connected to the system bus 40 are a transfer recipe creating section 41, a transfer recipe creating storage section 42, a transfer schedule creating section 43, a transfer schedule storage section 44, a transfer control section 45, and a standby position control section 46. Connected to the control section 4 are the delivery arm 23, the main transfer mechanisms 25-1 and 25-2, and the transfer arm 31, through controllers 51 to 54.

The transfer recipe creating section 41 has a function of, when the operator assigns a transfer order of the wafer W to the modules, creating a transfer recipe in which the modules and the transfer order of the wafer W are related with each other and storing the created transfer recipe in the transfer recipe storage section 42. "Module" means a part where the wafer W is to be placed, such as the delivery unit TRS1 and the reflection preventing film-coating unit BARC as a processing unit to make a predetermined processing. It is observed how one wafer W travels within the coating/developing apparatus. The wafer W starts from a cassette C and travels through the modules in the order of the delivery unit TRS1 and the reflection preventing film-coating unit BARC, viz., in the order in which treatments are carried out, and finally returns to the cassette C. To transfer the wafer W in this way, the operator determines the best route to transfer the wafer W depending on a kind of the wafer W, that is, he/she assigns a transfer order of the wafer to the modules.

Figure 8:
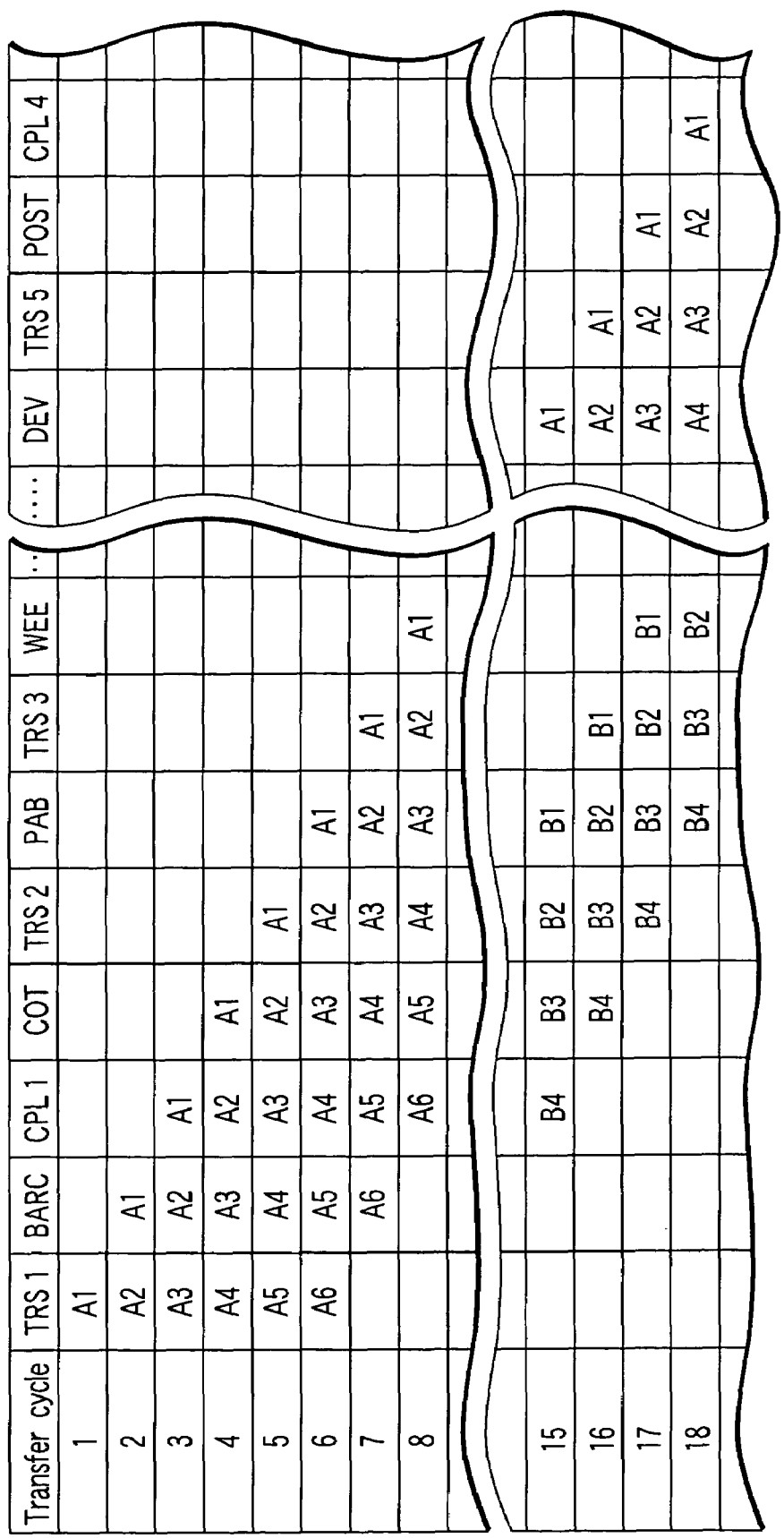
FIG. 8 is a diagram showing an example of a transfer schedule.

The transfer schedule creating section 43 has a function of referring to a transfer recipe and creating a transfer schedule to store the schedule into the transfer schedule storage section 44. The transfer schedule is created by relating the transfer order of the wafer W to the modules and time sequentially arranging data of a transfer cycle designated, and is as shown in FIG. 8. In the table, A1, A2, . . . , B1, B2, . . . represent wafers W. Those alphabetic letters attached with numerals represent each which of the lots and what number in the sequentially ordered wafers of the lot. For example, A1 is the front or first wafer of a lot A, A2 is a second wafer of the lot A, and B1 is a second wafer of a lot B.

A transfer system of the coating/developing apparatus is designed such that a job is done every transfer cycle (also called a phase). The transfer cycle defines transfer operations in which the wafers W are transferred one by one from the upstream module to the module located just downstream of the former, and finally to the most downstream module, and defines the modules and the wafer numbers of the wafers which are placed on the modules. The most downstream module is a module where the front wafer W is to be placed.

For example, to execute a transfer cycle 2 in FIG. 8 is to perform transfer operations to place the wafers A1 and A2 on the delivery unit TRS1 and the reflection preventing film-coating unit BARC, respectively. A time-sequential arrangement of such transfer cycles is the transfer schedule. In FIG. 8, the first module is denoted as the delivery unit TRS1, for ease of explanation.

The transfer control section 45 controls, while referring to the transfer schedule, a transfer system which contains, in this example, the delivery arm 23, the main transfer mechanisms 25-1 and 25-2, and the transfer arm 31.

The standby position control section 46 has the following function. The delivery arm 23, the main transfer mechanisms 25-1 and 25-2, and the transfer arm 31 are each referred to as a substrate transfer mechanism for ease of explanation. After one substrate transfer mechanism completes a job (transfer) allotted to the mechanism during one transfer cycle, the standby position control section refers to the transfer schedule during the one transfer cycle, and controls such that the one substrate transfer mechanism is moved to the front of the module in which the substrate transfer mechanism first performs the transfer operation in a next transfer cycle.

In the control rule, the module in which one substrate transfer mechanism first performs the transfer operation in the next transfer cycle is a module which meets as a rule a condition that the module is included in those modules allotted to the one substrate transfer mechanism, and it is the most upstream module of the modules where the wafers W are placed. When the wafers W whose lots are different are present in those modules allotted, a module on which a wafer W having first been transferred into the coating/developing apparatus is placed is the module in question. Incidentally, the lot means wafers W for each carrier C.

Operations of the present embodiment will be described. Two carriers C are carried into the carrier placing section B1. A group of wafers W in one of the carriers C is referred to as lot A, and another group of wafers W in the other carrier C is referred to as lot B. Lot A includes six wafers W, and lot B includes four wafers W. A brief operation description is first given. The transfer control section 45 refers to the transfer schedule shown in FIG. 8, and sequentially executes the transfer cycles from the first transfer cycle. To start with, the control section refers to the transfer cycle 1, and causes the delivery arm 23 to pick up a wafer A1 from the carrier C and to transfer it to the delivery unit TRS1. At this time point, the transfer cycle 1 ends.

Then, the transfer control section refers to a transfer cycle 2, causes one arm of the main transfer mechanism 25-1 to pick up the wafer A1 from the delivery unit TRS1 and to move to the front of the reflection preventing film-coating unit BARC, and transfers it to the coating unit. Then, the control section causes the delivery arm 23 to pick up a next wafer A2 from the carrier C and transfer it to the delivery unit TRS1.

Next, the transfer control section refers to a transfer cycle 3, and causes one arm of the main transfer mechanism 25-1 to pick up the wafer A2 from the delivery unit TRS1. Then, the transfer control section causes it to move to the front of the reflection preventing film-coating unit BARC, and causes another arm thereof to pick up the wafer A1 from the reflection preventing film-coating unit and causes the other arm to transfer the wafer A2 to the reflection preventing film-coating unit BARC. The main transfer mechanism 25-1 advances to the front of the cooling unit CPL1, and causes the arm mentioned above to advance and to transfer the wafer A1 into the cooling unit CPL1. In this way, each wafer travels through the modules. As shown in model form also in FIG. 6, after the wafer is transferred to the delivery unit TRS2, the main transfer mechanism 25-2 also joins the wafer transferring job. The description is general. However, when the front water of the 25 wafers of the same lot reaches the delivery unit TRS5, the main transfer mechanism 25-1 waits until the transfer operations of the main transfer mechanism 25-2 and the transfer arm 31 end in the same transfer cycle after the transfer operation from the resist coating unit COT to the delivery unit TRS2 ends, and then also transfers the wafer from the delivery unit TRS5 to the heating unit POST.

A characteristic feature of the embodiment is a system in which a plurality of substrate transfer mechanisms as a transfer system are provided and the jobs in the transfer cycle are shared by the substrate transfer mechanisms. As stated also in the description of the transfer control section 45, when the job (transfer operation) of one substrate transfer mechanism ends in one transfer cycle, and, for example, when another substrate transfer mechanism is in transfer operation, the substrate transfer mechanism refers to the transfer schedule and stands by at the front of the front module to be involved in the job of the transfer mechanism in the next transfer cycle. In this way, the wafer transfer operation is efficiently performed.

Figure 9:
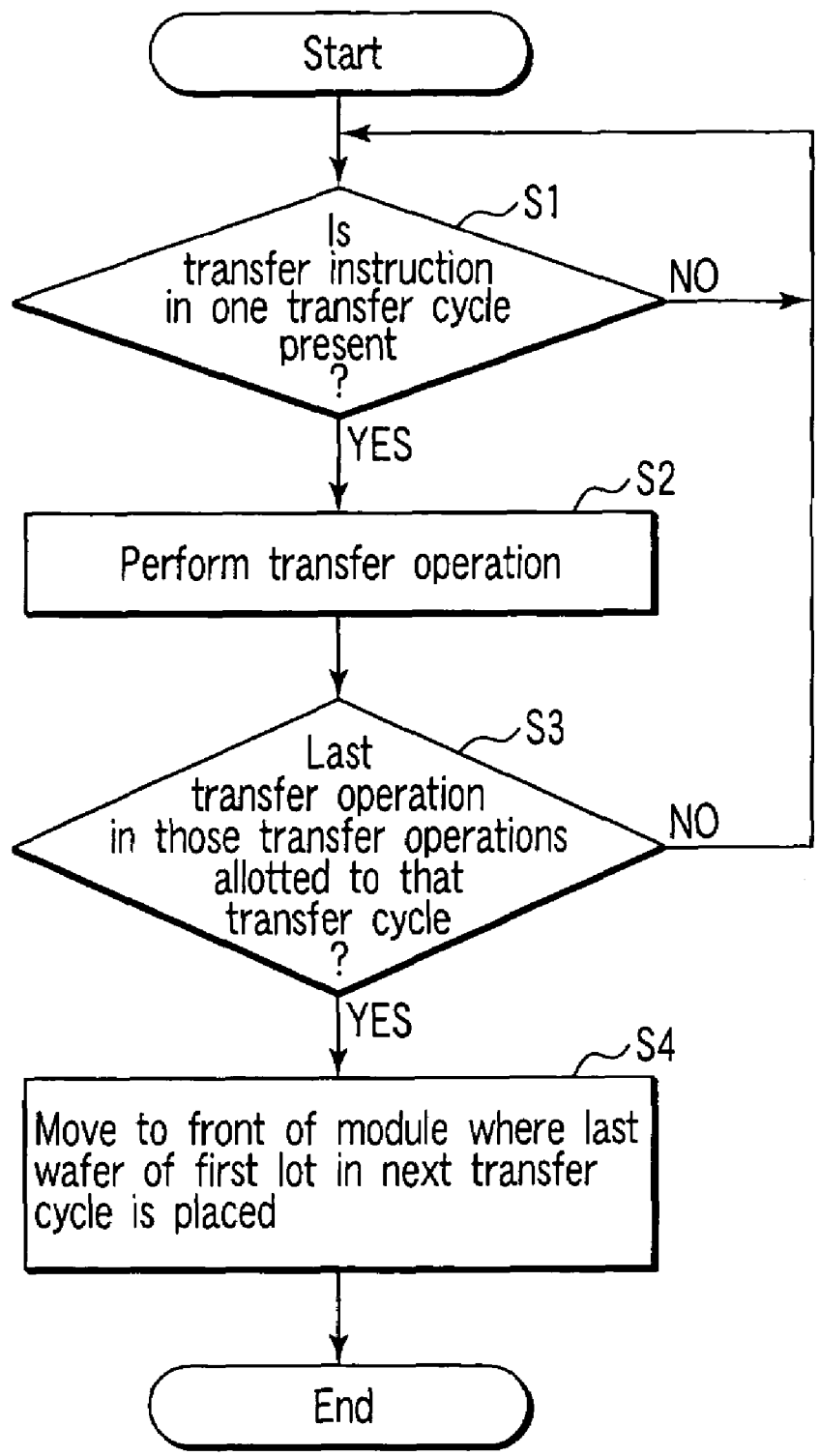
FIG. 9 is a flow chart showing operations of a main transfer mechanism.

To be more specific, it is assumed that a transfer cycle 7 shown in FIG. 8 is being executed. At this time, the main transfer mechanism 25-1 as one of the paired main carrying mechanisms operates according to a transferring flow shown in FIG. 9. When receiving a transfer instruction in step S1, the main transfer mechanism performs a transfer operation in step S2. When the main transfer mechanism 25-1 has transferred a wafer A6 from the delivery unit TRS1 to the reflection preventing film-coating unit BARC, the transfer operation has not yet ended. Accordingly, the answer to step S3 is "NO", and the transfer mechanism returns to step Si where it performs the transfer operation having been not yet performed. As a result, the wafer is transferred from the upstream module of the module group to the module located directly downstream of the former.

As shown in FIG. 10, when the main transfer mechanism 25-1 has transferred the wafer A3 to the delivery unit TRS2, the transfer mechanism advances to step S4 since this transfer operation is the last transfer operation by the main carrying mechanism 25-1, allotted to the transfer cycle 7. In step S4, the main transfer mechanism moves to and stands by at the front of a module involved in the transfer operation of the last wafer of the first lot in a transfer cycle 8 as the next transfer cycle, that is, the reflection preventing film-coating unit BARC. In other words, the main transfer mechanism moves to and stands by at the front of the module where the last wafer of the first lot in the data of the transfer cycle 7 having completed the transfer operation.

Figure 11:
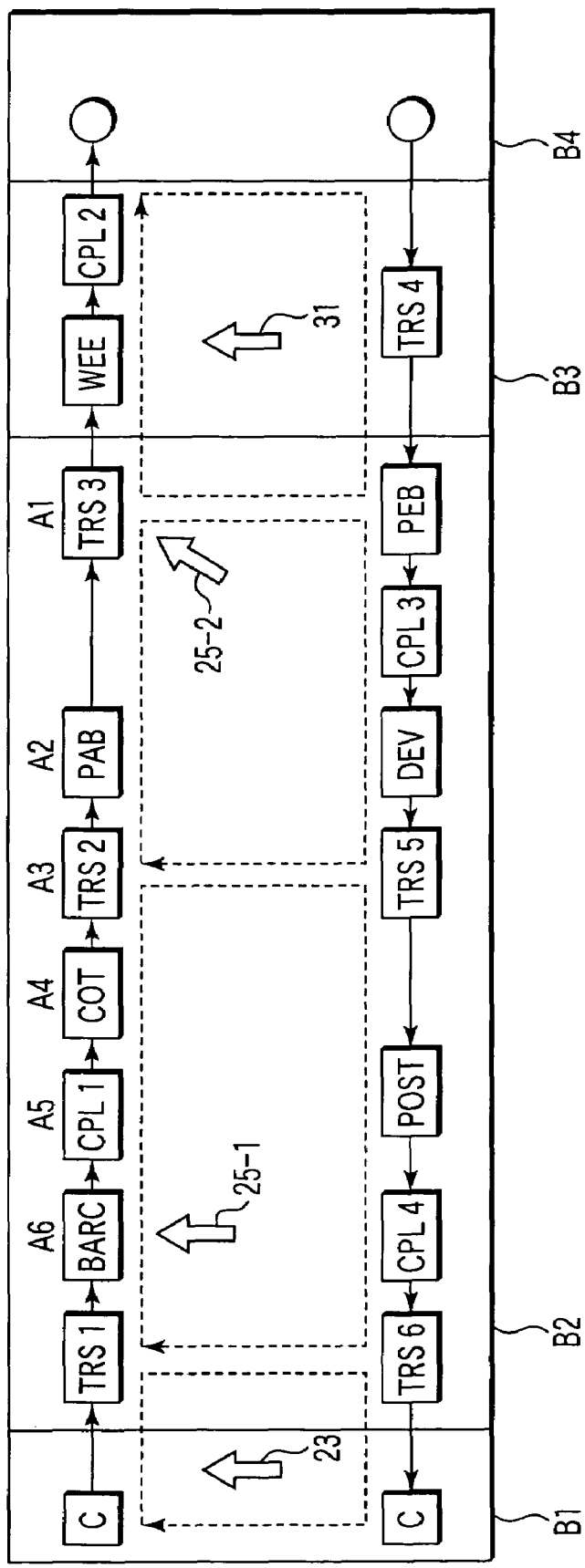
FIG. 11 is a plan view showing in model form positional relationships between respective transfer mechanisms substantially in the end part of the transfer cycle and wafers.

FIG. 11 shows this state. "The main transfer mechanism moves to and stands by at the front of the module" means such a state that the arms 105 to 107 (FIG. 3) are confronted with the transfer port of the module, and are ready for advancement into the transfer port of the module if the arms are moved forward.

In the transfer cycle 7, the wafer transfer operation is performed by the main transfer mechanism 25-2 as the other of the paired main carrying mechanisms, and at a time point where the wafer A1 has been transferred to the delivery unit TRS3, the transfer cycle 7 ends. Then, the transfer cycle 8 starts, and the main transfer mechanism 25-1 moves to take a wafer A6 in the reflection preventing film-coating unit BARC. The main transfer mechanism has moved to the front of the reflection preventing film-coating unit BARC during the transfer operation of the main transfer mechanism 25-2. Accordingly, the transfer operations are smoothly performed.

Description will be given by using a transfer cycle 16 as an example.

Figure 12:
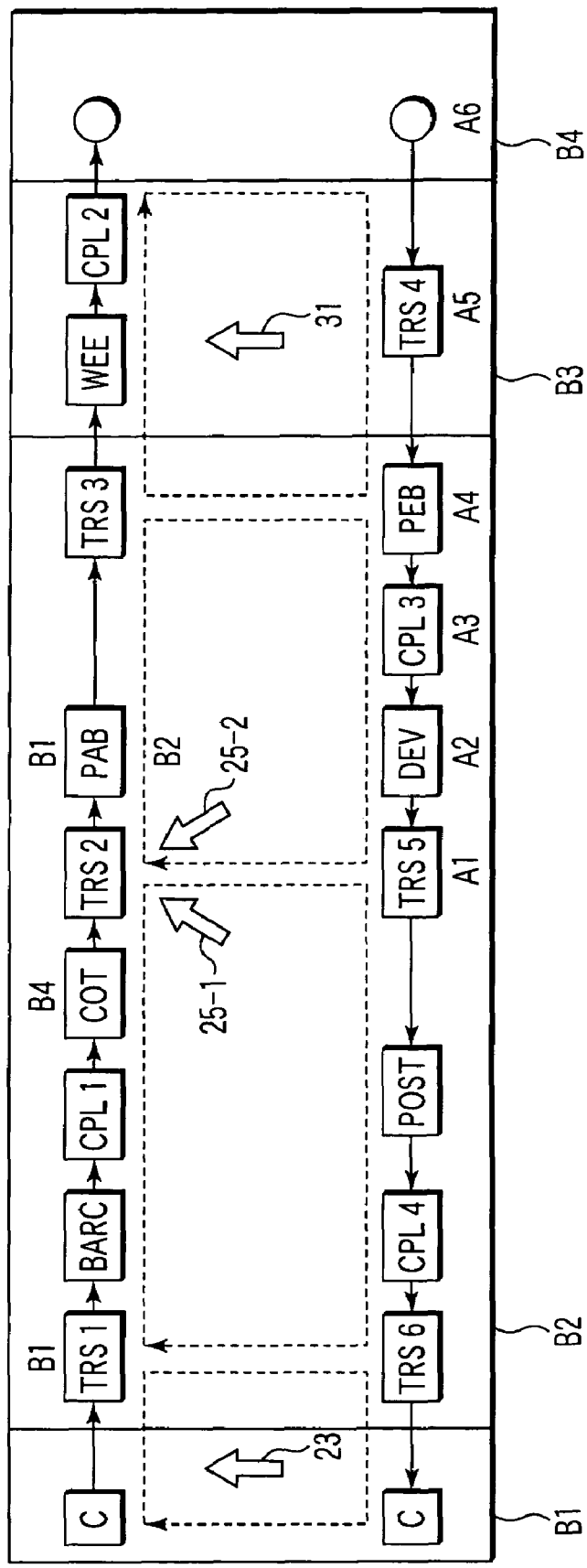
FIG. 12 is a plan view showing in model form positional relationships between respective transfer mechanisms in the middle of another transfer cycle and wafers.
Figure 13:
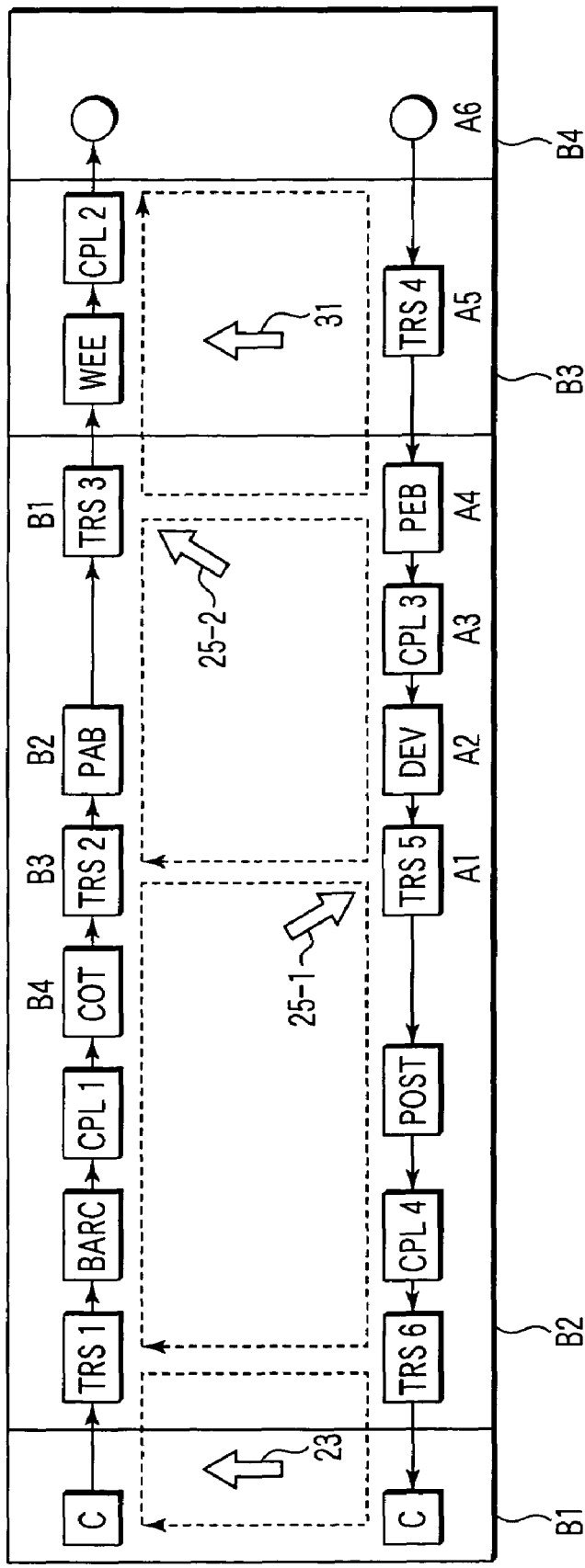
FIG. 13 is a plan view showing in model form positional relationships between respective transfer mechanisms substantially in the end part of the other transfer cycle and wafers.
Figure 14:
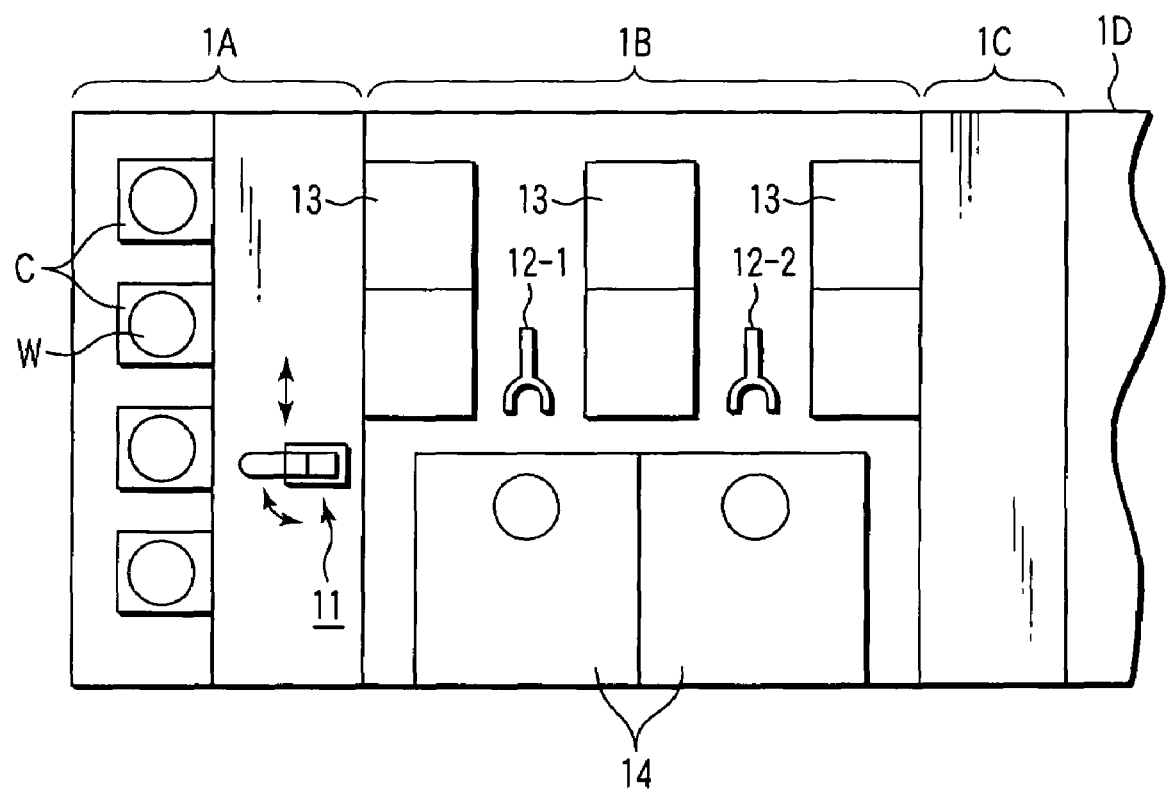
FIG. 14 is a plan view schematically showing a conventional coating/developing apparatus.

The transfer operation of the main transfer mechanism 25-1 starts from an operation of taking out a wafer B4 from the cooling unit CPL1 and ends at the operation to transfer a wafer B2 to the delivery unit TRS2 as shown in FIG. 12. Following this, the main transfer mechanism 25-2 performs the transfer operation, without any interruption. During this operation, the main transfer mechanism 25-1 moves to and stands by at the front of a module involved in the transfer operation of the last wafer of the first lot in a transfer cycle 17 as the next transfer cycle. In this case, lot A is carried into the device earlier than lot B. Accordingly, the first lot is lot A, and the last wafer is wafer A1 as shown in FIG. 8 (If wafers A1 and Wafer A2 are within an accessible range within which the main transfer mechanism 25-1 is accessible as at the end of the transfer cycle 17, the last wafer is wafer A2.) That is, in this case, the module involved in the transfer operation of the last wafer of the first lot in the next transfer cycle is the delivery unit TRS5, and the main transfer mechanism 25-1 moves to and stands by at the front of the delivery unit TRS5, as shown in FIG. 13.

When the transfer cycle 17 starts, the wafers of lot A are sequentially transferred from the upstream module to the module directly downstream of the former. The main transfer mechanism 25-1 performs its first transfer operation, viz., it takes out wafer A1 from the delivery unit TRS5 and transfers it to the heating unit POST. When seeing from the wafer side of lot A, the transfer operation corresponds to the last transfer operation of lot A. Subsequently, in the transfer cycle 17, the wafers of lot B are transferred from the downstream module sequentially.

A case where the main transfer mechanism 25-1 anticipates the next transfer cycle to move and stand by, has been described. The same thing is true for the main transfer mechanism 25-2. When the main transfer mechanism completes the transfer operation allotted to itself in the transfer cycle 7, for example, it moves to and stands by at the front of the delivery unit TRS2.

In the embodiment mentioned above, when attention is focused on the main transfer mechanism 25-1, the main transfer mechanism 25-1 corresponds to one substrate transfer mechanism, and is subjected to the standby control. When attention is focused on the main transfer mechanism 25-2, the main transfer mechanism 25-2 corresponds to one substrate transfer mechanism, and is subjected to the standby control.

In the transfer schedule of FIG. 8, each of the treatment units consists of a single unit. Actually, as shown FIGS. 2 and 4, a plurality of processing units of the same type are provided. In such a case, the number of transfer cycles is merely increased, and hence, it is believed that the description simplified as shown in FIG. 8 creates no problem in explaining the invention.

According to the embodiment mentioned above, in the conditions that after the main transfer mechanism 25-1 or 25-2 completes the transfer operations allotted to itself in one transfer cycle, and before the one transfer cycle ends, for example, during the transfer operation of the main transfer mechanism 25-1 (25-2) or the delivery arm 23, the main transfer mechanism refers to the transfer schedule and moves to and stands by at the front module involved in the transfer operation allotted to itself in the next transfer cycle. With such a characteristic feature, when each transfer cycle starts, the main carrying mechanism is able to transfer the wafer by merely extending the arm. Accordingly, the jobs in the transfer cycle are more swiftly carried out than in the case where the main transfer mechanisms 25-1 and 25-2 are located at the initial positions, and are each moved to the front of the module, from the initial position. The result is that high throughput is secured.

It should be understood that the present invention is not limited to the coating/developing apparatus, but the invention may be applied to an insulating film forming device into which a unit for coating a substrate with a liquid chemical containing the precursor of the insulating film dissolved thereinto, a unit which then gels the coating solution, a baking unit, a curing unit, a cooling unit, etc., are incorporated. The substrate is not limited to the wafer, but may be a flat panel, such as a glass substrate for liquid crystal display.

What is claimed is:

1. A substrate processing apparatus comprising a group of modules which apply parallel processing to a plurality of substrates of which the transfer order is designated, and a plurality of substrate transfer mechanisms, each of which shares a predetermined number of modules of the module group, and transfers substrates to a plurality of the shared modules, wherein each of the substrate transfer mechanisms executes one transfer cycle by sharing the operations of transferring a substrate from one module to another module later by one in order by the substrate transfer mechanisms, shifts to a next transfer cycle after executing the one transfer cycle, and executes the next transfer cycle, whereby the substrates are sequentially transferred from the module being low in order in the module group to the module being high in order in a state that the succeeding substrate does not overtake the preceding substrate, the substrate processing apparatus further comprising:

a transfer schedule creating section which assigns a transfer order to said plurality of substrates in a plurality of lots according to a predetermined transfer recipe, relates the assigned transfer order of the substrate to the shared modules to specify a transfer cycle, and creates a transfer schedule by time sequentially arranging data of the specified transfer cycle;

a transfer schedule storage section which stores the transfer schedule created by the transfer schedule creating section;

a transfer control section which controls, by referring to the transfer schedule stored in the transfer schedule storage section, the substrate transfer mechanism so as to transfer a substrate written into the data of the transfer cycle to the shared module corresponding to the substrate, thereby causing the substrate transfer mechanism to execute the transfer cycle; and a standby position control section which operates such that, by referring to the transfer schedule, after one of said plurality of substrate transfer mechanisms completes the transfer operations allotted to itself in one transfer cycle, and during the execution of the one transfer cycle by another substrate transfer mechanism, the standby position control section anticipates from the transfer schedule a module of those shared by the one substrate transfer mechanism, at which a last wafer of a first lot is placed in a next transfer cycle, and puts the one substrate transfer mechanism on standby at the anticipated module.

2. The substrate processing apparatus according to claim 1, wherein the transfer control section causes the one substrate transfer mechanism to sequentially transfer the substrate to a plurality of modules allotted to the one substrate transfer mechanism in the one transfer cycle, and then causes the other substrate transfer mechanism to sequentially transfer the substrate to a plurality of modules allotted to the other substrate transfer mechanism, the standby position control section causes the one substrate transfer mechanism to move to a front module to which the substrate is to first be transferred, in those modules allotted to the one substrate transfer mechanism in the one transfer cycle, and puts the one substrate transfer mechanism on standby until a next transfer cycle starts, and the transfer control section causes the one substrate transfer mechanism to sequentially transfer again the substrate to the modules allotted to the one substrate transfer mechanism in the next transfer cycle.

3. The substrate processing apparatus according to claim 1 or 2, wherein the other substrate transfer mechanism is provided between a carrier containing a plurality of substrates and a delivery unit, and the one substrate transfer mechanism is provided between each module of the module group and the delivery unit.

4. The substrate processing apparatus according to claim 1 or 2, wherein the one substrate transfer mechanism is provided between the adjacent modules of the module group, and the other substrate transfer mechanism is also provided between the adjacent modules of the module group.

5. The substrate processing apparatus according to claim 4, wherein the substrate transfer mechanism takes out a first substrate from one module of the module group, receives a second substrate from a next module of the module group, and then transfers the first substrate to the next module.

6. The substrate processing apparatus according to claim 1, wherein, when a plurality of modules of which the lots are different are contained in the modules allotted to the substrate transfer mechanism, the substrate transfer mechanism transfers first the substrate of the lot, which is first transferred to the module of those allotted thereto.

7. The substrate processing apparatus according to claim 1, wherein the module group includes a module which coats a substrates with resist, a module which coats a substrate with a developer, a module which heats a substrate, and a module which cools a substrate, whereby a substrate is subjected to resist coating treatment, and the resultant having been exposed is subjected to developing treatment.

8. A substrate treatment method in which, when a plurality of substrates to which a transfer order is assigned in a plurality of lots are transferred to individual modules of a module group by means of a plurality of substrate transfer mechanisms, each of the substrate transfer mechanisms executes one transfer cycle by sharing the operations of transferring a substrate from one module to another module later by one in order by the substrate transfer mechanisms, shifts to a next transfer cycle after executing the one transfer cycle, and executes the next transfer cycle, whereby the substrates are sequentially transferred from the module low in order of the module group to the module high in order in a state that the succeeding substrate does not overtake the preceding substrate, the method comprising:

a) a step of sequentially transferring the substrates to and from the modules allotted to one substrate transfer mechanism by the one substrate transfer mechanism;

b) a step of transferring the substrate from the one substrate transfer mechanism to another substrate transfer mechanism through the module, and sequentially transferring the substrates to and from the modules allotted to the other substrate transfer mechanism by the other substrate transfer mechanism; and (c) a step of, by referring to a transfer schedule, after one substrate transfer mechanism of said plurality of substrate transfer mechanisms completes the transfer operations allotted to itself in one transfer cycle, and during execution of the one transfer cycle by another substrate transfer mechanism, anticipating from the transfer schedule a module of those shared by the one substrate transfer mechanism, at which a last wafer of a first lot is placed in a next transfer cycle, and putting the one substrate transfer mechanisms on standby at the anticipated module.

9. The method according to claim 8, further comprising:

in the one transfer cycle in the step (c), causing the one substrate transfer mechanism to sequentially transfer the substrate to a plurality of modules allotted to the one substrate transfer mechanism, and then causing the other substrate transfer mechanism to sequentially transfer the substrate to a plurality of modules allotted to the another substrate transfer mechanism;

in the one transfer cycle, causing the one substrate transfer mechanism to move to a front module to which the substrate is to first be transferred in those modules allotted to the one substrate transfer mechanism, and putting the one substrate transfer mechanism on standby until a next transfer cycle starts; and in the next transfer cycle, causing the one substrate transfer mechanism to sequentially transfer again the substrate to the modules allotted to the one substrate transfer mechanism.

10. The method according to claim 8 or 9, wherein the substrate transfer mechanism takes out a first substrate from one module of the module group, receives a second substrate from a next module of the module group, and then transfers the first substrate to the next module.

11. The method according to claim 8, wherein the module group includes a module which coats a substrates with resist, a module which coats a substrate with a developer, a module which heats a substrate, and a module which cools a substrate, whereby a substrate is subjected to resist coating treatment, and the resultant having been exposed is subjected to developing treatment.

12. A program executed by a computer system in which, when a plurality of substrates to which a transfer order is assigned in a plurality of lots are transferred to individual modules of a module group by means of a plurality of substrate transfer mechanisms, each of the substrate transfer mechanisms executes one transfer cycle by sharing the operations of transferring a substrate from one module to another module later by one in order by the substrate transfer mechanisms, shifts to a next transfer cycle after executing the one transfer cycle, and executes the next transfer cycle, whereby the substrates are sequentially transferred from the module low in order of the module group to the module high in order in a state that the succeeding substrate does not overtake the preceding substrate, the method comprising:

a) a procedure of sequentially transferring the substrates to and from the modules allotted to one substrate transfer mechanism by the one substrate transfer mechanism;

b) a procedure of transferring the substrate from the one substrate transfer mechanism to another substrate transfer mechanism through the module, and sequentially transferring the substrates to and from the modules allotted to the another substrate transfer mechanism by the another substrate transfer mechanism; and (c) a procedure of, by referring to a transfer schedule, after one substrate transfer mechanism of said plurality of substrate transfer mechanisms completes the transfer operations allotted to itself in one transfer cycle, and during execution of the one transfer cycle by another substrate transfer mechanism, anticipating from the transfer schedule a module of those shared by the one substrate transfer mechanism, at which a last wafer of a first lot is placed in a next transfer cycle, and putting the one substrate transfer mechanism on standby at the anticipated module.

* * * * *